United States Patent
Bazarsky et al.

(10) Patent No.: US 10,811,091 B2
(45) Date of Patent: Oct. 20, 2020

(54) ADAPTIVE PROCESSING FOR READ THRESHOLD VOLTAGE CALIBRATION

(71) Applicant: WESTERN DIGITAL TECHNOLOGIES, INC., San Jose, CA (US)

(72) Inventors: Alexander Bazarsky, Holon (IL); David Avraham, Even Yehuda (IL); Eran Sharon, Rishon (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 54 days.

(21) Appl. No.: 16/158,941

(22) Filed: Oct. 12, 2018

(65) Prior Publication Data
US 2020/0118620 A1    Apr. 16, 2020

(51) Int. Cl.
*G11C 11/56* (2006.01)
*G06F 11/10* (2006.01)
*G11C 29/42* (2006.01)

(52) U.S. Cl.
CPC ...... *G11C 11/5642* (2013.01); *G06F 11/1048* (2013.01); *G06F 11/1072* (2013.01); *G11C 11/5628* (2013.01); *G11C 29/42* (2013.01); *G06F 2201/81* (2013.01)

(58) Field of Classification Search
CPC . G11C 11/5642; G11C 11/5628; G11C 29/42; G06F 11/1072; G06F 11/1048; G06F 2201/81
See application file for complete search history.

(56) References Cited

U.S. PATENT DOCUMENTS

| 7,814,401 | B2 | 10/2010 | Alrod et al. |
| 8,099,652 | B1 | 1/2012 | Alrod et al. |
| 8,503,237 | B1 | 8/2013 | Horn |
| 8,605,502 | B1 | 12/2013 | Desiredd, I et al. |
| 8,782,495 | B2 | 7/2014 | Alrod et al. |
| 8,811,076 | B2 | 8/2014 | Venkitachalam et al. |
| 8,838,883 | B2 | 9/2014 | D'Abreu et al. |

(Continued)

FOREIGN PATENT DOCUMENTS

| CN | 102568593 A | 7/2012 |
| CN | 102884585 A | 1/2013 |
| WO | 2013/048467 A1 | 4/2013 |

OTHER PUBLICATIONS

Yang, Nian Niles et al. "Inspection of Non-Volatile Memory for Disturb Effects," U.S. Appl. No. 61/736,983, filed Dec. 13, 2012, 26 pages.

*Primary Examiner* — Thien Nguyen
(74) *Attorney, Agent, or Firm* — Michael Best & Friedrich LLP

(57) ABSTRACT

A device that includes a non-volatile memory and a controller. The controller is coupled to the non-volatile memory. The controller includes a non-transitory computer readable medium and a processor. The controller includes computer executable instructions stored in the computer readable medium to, using the processor, retrieve a flash memory page from the non-volatile memory, determine a memory parameter associated with the flash memory pages, determine a read threshold voltage scanning order based on the memory parameter, and perform read threshold voltage calibration according to the read threshold voltage scanning order.

17 Claims, 6 Drawing Sheets

(56) References Cited

U.S. PATENT DOCUMENTS

| | | |
|---|---|---|
| 8,874,992 B2 | 10/2014 | Desireddi et al. |
| 9,450,610 B1 | 9/2016 | Micheloni |
| 9,697,905 B2 * | 7/2017 | Sharon ................ G06F 11/1048 |
| 9,720,754 B2 | 8/2017 | Karakulak et al. |
| 9,728,263 B2 | 8/2017 | Sharon et al. |
| 9,761,308 B1 | 9/2017 | Cometti |
| 9,768,807 B2 | 9/2017 | Zhang et al. |
| 2007/0091677 A1 | 4/2007 | Lasser et al. |
| 2008/0092026 A1 | 4/2008 | Brandman et al. |
| 2008/0263266 A1 | 10/2008 | Sharon et al. |
| 2009/0323422 A1 | 12/2009 | Alrod et al. |
| 2010/0131697 A1 | 5/2010 | Alrod et al. |
| 2010/0192042 A1 | 7/2010 | Sharon et al. |
| 2011/0066902 A1 | 3/2011 | Sharon et al. |
| 2011/0161775 A1 | 6/2011 | Weingarten |
| 2011/0205823 A1 | 8/2011 | Hemink et al. |
| 2012/0140560 A1 | 6/2012 | Yang |
| 2012/0166913 A1 | 6/2012 | Alrod et al. |
| 2012/0265927 A1 | 10/2012 | Cho et al. |
| 2012/0268994 A1 | 10/2012 | Nagashima |
| 2013/0055047 A1 | 2/2013 | Sharon et al. |
| 2013/0077400 A1 | 3/2013 | Sakurada |
| 2013/0111279 A1 | 5/2013 | Jeon et al. |
| 2013/0132652 A1 | 5/2013 | Wood et al. |
| 2013/0275651 A1 | 10/2013 | D'Abreu et al. |
| 2013/0290597 A1 | 10/2013 | Faber |
| 2013/0297988 A1 | 11/2013 | Wu et al. |
| 2014/0143630 A1 | 5/2014 | Mu et al. |
| 2014/0173172 A1 | 6/2014 | Yang et al. |
| 2014/0204671 A1 * | 7/2014 | Sharon ................ G11C 29/04 365/185.09 |
| 2014/0269052 A1 | 9/2014 | Dusija et al. |
| 2014/0281823 A1 | 9/2014 | Micheloni et al. |
| 2014/0286102 A1 | 9/2014 | Wu et al. |
| 2014/0293696 A1 | 10/2014 | Lin et al. |
| 2014/0334228 A1 | 11/2014 | Kim et al. |
| 2014/0355340 A1 * | 12/2014 | Sharon ................ G11C 29/04 365/185.03 |
| 2014/0372678 A1 | 12/2014 | Moon et al. |
| 2015/0085573 A1 * | 3/2015 | Sharon ................ G11C 16/26 365/185.03 |
| 2016/0092303 A1 | 3/2016 | Yang |
| 2016/0117216 A1 | 4/2016 | Muchherla et al. |
| 2016/0125921 A1 | 5/2016 | Kambegawa |
| 2017/0125111 A1 | 5/2017 | Sankaranarayanan ...................... G06F 11/0727 |
| 2018/0011753 A1 * | 1/2018 | Alhussien ............ G06F 11/0775 |
| 2018/0286495 A1 * | 10/2018 | Oh ........................ G11C 29/021 |
| 2019/0237146 A1 * | 8/2019 | Malshe ................ G11C 7/06 |

* cited by examiner

ADAPTIVE PROCESSING FOR READ THRESHOLD VOLTAGE CALIBRATION

BACKGROUND

Commercial electronic devices have become more portable and capable as data storage devices including non-volatile memory have improved. These data storage devices include, for example, embedded flash memory devices, universal serial bus ("USB") flash memory devices, removable storage cards, etc. Such storage devices are increasingly able to store more data due to, for example, increased storage density for individual memory cells. Flash memory devices, in particular, are capable of providing increased storage density by storing more than a single bit of data in a single flash memory cell. For example, flash memory devices increase data storage density by storing three bits of data per cell ("3BPC"), four bits of data per cell ("4BPC"), or more than four bits of data per cell. These memory cells are referred to as multi-level cells ("MLC") because they are capable of storing more than a single bit of data per cell. Memory cells that store a single bit of data per cell are referred to as single level cells ("SLC").

The number of possible states to which a single memory cell can be programmed is dependent upon the number of bits per cell of that single memory cell. For example, an SLC memory cell can be programmed to one of two states (i.e., a zero or a one). A single memory cell that includes two bits of data per memory cell ("2BPC") can be programmed to one of four states. The number of states to which a memory cell can be programmed is equal to $2^N$ states, where N is the number of bits per memory cell. Therefore, a 3BPC memory cell includes a total of eight possible states. A 4BPC memory cell includes a total of sixteen possible states.

Each possible state of a particular memory cell has an assigned bit sequence. For example, in a 2BPC memory cell, the assigned bit sequences are "00", "01", "10", and "11." The bit sequences that are assigned or mapped to particular states of a memory cell can vary by manufacturer. After bit sequences have been assigned for a particular flash memory cell, the flash memory cell can be programmed to a state by setting a threshold voltage, $V_{TH}$, for the flash memory cell (i.e., applying a charge to the floating gate of the flash memory cell). The threshold voltage, $V_{TH}$, will be set to correspond to the desired sequence of bits for the flash memory cell. After the flash memory cell has been programmed, the data stored in the flash memory cell (i.e., the flash memory cell's bit sequence), can be read by measuring or sensing the programmed state of the flash memory cell. The programmed state of the flash memory cell is read by comparing the flash memory cell's threshold voltage, $V_{TH}$, to one or more read threshold voltages. The number of read threshold voltages used for a particular flash memory cell is related to the number of bits in the flash memory cell. For example, a 4BPC flash memory cell may use four read threshold voltages. Based on the results of scanning the read threshold voltages, a device or controller that is scanning the read threshold voltages can determine the programmed bit sequence of the flash memory cell.

SUMMARY

One of the difficulties associated with reading data from flash memory cells is the sensitivity of the flash memory cells to a variety of conditions related to the memory. For example, the structure of a memory (e.g., memory cells, word lines, blocks, dies, etc.), the condition of the memory (e.g., temperature when reading, temperature when programming, data retention, etc.), and the operational mode of the memory (e.g., read failure recover, read threshold voltage calibration, etc.) can each affect the ability of a controller to efficiently and effectively read data from the flash memory cells.

As an illustrative example, temperature is an increasingly significant factor for flash memory. Variations between a temperature of a flash memory cell when data is written to the flash memory cell (i.e., programming temperature) and a temperature when data is read from the flash memory cell (i.e., reading temperature) can result in the flash memory cell's read threshold voltages shifting. Voltage threshold shifts can alter cell voltage distributions ("CVDs") of the different states of a multi-level cell ("MLC") flash memory cell. Alteration of CVDs can occur in both temperature directions (i.e., higher temperatures or lower temperatures when compared to programming temperature). Temperature is particularly problematic for flash memory cells because each flash memory cell can potentially exhibit different shifts in threshold voltages due to each memory cell having a distinct cross temperature coefficient.

When a flash memory cell's read threshold voltages have shifted, attempting to determine the programmed state or bit sequence of the flash memory cell using inaccurate read threshold voltages can result in an increased bit error rate ("BER"). To reduce BER and more accurately determine the programmed state of the flash memory cell, a controller can adjust or modify the read threshold voltages that are used to determine the programmed state of the flash memory cell.

Read threshold voltages can be modified as part of low-density parity check ("LDPC") error-correcting code ("ECC") decoding that is performed by a controller attempting to read data from a flash memory cell. However, the amount of time required for the controller to modify the read threshold voltages and determine the programmed state of the memory cell can significantly inhibit the performance of the controller. The controller modifying read threshold voltages can introduce latency because the read threshold voltage calibration process involves searching on several dimensions, which is dependent upon the number of read thresholds. As a result, the latency introduced by the controller is increased when the controller is attempting to read data from MLCs, such as three bits per cell ("3BPC") flash memory cells or four bits per cell ("4BPC") flash memory cells.

The modification of read threshold voltages is conventionally performed in a predetermined or preset sequential manner. For example, a 3BPC flash memory cell has eight possible states. For convenience, these states can be identified as follows: Erase ("Er"), A, B, C, D, E, F, and G. A read threshold voltage between the Er and A states of the flash memory cell is initially set to a read threshold voltage value, $V_A$. However, when the threshold voltage between the Er and A states of the flash memory cell has shifted, attempting to read data from the flash memory cell using the read threshold voltage value, $V_A$, will result in an increased BER. To reduce the BER and more accurately read the data from the flash memory cell, the value of the read threshold voltage, $V_A$, should be increased or decreased (i.e., calibrated). The calibration of a read threshold voltage is conventionally achieved using a rigorous series of hypotheses or trial values for a particular read threshold voltage. The hypotheses for the read threshold voltage correspond to slight modifications to the value for the read threshold voltage (i.e., an increase or decrease in the value of the read threshold voltage).

Conventional read threshold voltage calibration involves progressing through the hypotheses for the read threshold voltage in a preset, sequential order. However, having a preset, sequential order for performing read threshold voltage calibration can result in an inefficient read threshold voltage calibration process (i.e., a high latency read threshold voltage calibration process). The inefficiency of the read threshold voltage calibration process increases as more and more bits are added to flash memory cells (e.g., 3BPC, 4BPC, etc.). For example, a 4BPC flash memory cell includes four read threshold voltages (e.g., generically identified as $V_1$, $V_2$, $V_3$, and $V_4$). It is possible that the third read voltage threshold, $V_3$, or the fourth read threshold voltage, $V_4$, significantly contributes to the BER during LDPC ECC decoding. Following a preset, sequential read threshold voltage calibration can result in hundreds of hypotheses being performed before the controller starts adjusting the third read threshold voltage, $V_3$, or fourth read threshold voltage, $V_4$. When the third read threshold voltage, $V_3$, or fourth read threshold voltage, $V_4$, is the read threshold voltage that needs to be adjusted to reduce BER to an acceptable level, the latency introduced by the read threshold voltage calibration process can be prohibitive (e.g., the controller fails to satisfy quality of service ["QoS"] requirements for data storage devices).

Embodiments described herein improve the speed and efficiency of data storage devices by adapting the order in which read threshold voltages are calibrated. For example, the hypotheses conventionally associated with a particular read threshold voltage (e.g., $V_A$, $V_B$, $V_C$, etc.) are not preset or predetermined. Rather, a controller associated with a data storage device is configured to use inputs for the read threshold voltage calibration to determine a sequence or scanning order for the read threshold voltage calibration. These inputs or parameters include the structure of the memory, the condition of the memory, and the operational mode of the memory.

By adapting or modifying the order in which hypotheses of a read threshold voltage calibration are performed, significant improvements in the efficiency of reading data from a non-volatile memory of a data storage device are achieved. The efficiency improvements are the result of potentially significant reductions in the latency introduced by the read threshold voltage calibration process (e.g., approximately 30 µs-3 ms reductions in processing time for a page of 4BPC flash memory cells). Additionally, because the read threshold voltages are calibrated more efficiently, the amount of power required by a controller to perform the read threshold voltage calibration is correspondingly reduced.

These improvements in the efficiency and power consumption requirements for data storage devices are notable given the increased implementation of non-volatile memory devices in battery-powered products. The efficiency of the read threshold voltage calibration process and the reduction in power consumed during the read threshold voltage calibration process function to conserve the battery life of these battery-powered products.

These advantages are particularly notable as the number of bits per memory cell increase (e.g., 3BPC, 4BPC, etc.). Conventional read threshold voltage calibration techniques will require more and more processing time and power as the number of bits per flash memory cell increase. At a certain point, conventional read threshold voltage calibration techniques will introduce a prohibitive amount of latency and cannot be used with high bit per cell memories. The adaptable or modifiable read threshold voltage calibration process is particularly well-suited for such high bit per cell memories. As the number of bits per memory cell increase, so do the processing time and power savings over conventional read threshold voltage calibration techniques.

Embodiments described herein provide a device that includes a non-volatile memory and a controller. The controller is coupled to the non-volatile memory. The controller includes a non-transitory computer readable medium and a processor. The controller is configured to, using the processor, retrieve a flash memory page from the non-volatile memory, determine a memory parameter associated with the flash memory page, determine a read threshold voltage scanning order based on the memory parameter, and perform read threshold voltage calibration according to the read threshold voltage scanning order.

Embodiments described herein provide a computer-implemented method for controlling read threshold voltage calibration. The method includes, using a processor, retrieving a flash memory page from a non-volatile memory, determining a memory parameter associated with the flash memory pages, determining a read threshold voltage scanning order based on the memory parameter, and performing read threshold voltage calibration according to the read threshold voltage scanning order.

Embodiments described herein provide a controller for controlling read threshold voltage calibration. The controller includes a non-transitory computer readable medium and a processor. The controller includes computer executable instructions stored in the computer readable medium to retrieve a flash memory page from the non-volatile memory, determine a memory parameter associated with the flash memory pages, determine a read threshold voltage scanning order based on the memory parameter, and perform read threshold voltage calibration according to the read threshold voltage scanning order.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers" and "computing devices" described in the specification can include one or more processing units, one or more computer-readable medium modules, one or more input/output interfaces, and various connections (e.g., a system bus) connecting the components.

Other aspects of the embodiments will become apparent by consideration of the detailed description and accompanying drawings.

DETAILED DESCRIPTION

Embodiments described herein relate to reading data from a non-volatile memory, such as a flash memory, and an improved system and process for calibrating the read threshold voltages used to read the data from the non-volatile memory. A controller associated with a data storage device is configured to read data from the non-volatile memory. The data read from the non-volatile memory can be stored in memory cells that include more than a single bit of data per memory cell (i.e., they include multiple bits of data per memory cell). Such memory cells are known as multi-level cells ("MLCs"). The controller uses multiple read threshold voltages to read the data from the MLCs. For example, the controller may use four read threshold voltages to read the data from a four bits per cell ("4BPC") memory cell. However, the read threshold voltages can shift from their expected values as the result of a variety of parameters of the non-volatile memory. As a result, to effectively read the data form the memory cells after the read threshold voltages have shifted, the controller adjusts or calibrates the read threshold voltages. Conventional read threshold voltage calibration was performed using a preset order for scanning hypotheses for the read threshold voltages. Such a technique has the potential to introduce significant latency into the read threshold voltage calibration. Embodiments described herein improve the efficiency of the controller (i.e., reduced processing time) and reduces power consumption by the controller (i.e., as a result of improved efficiency) during read threshold calibration. Improved efficiency and reduced power consumption is achieved by adapting the sequence or scanning order of the read threshold voltages based on, for example, a parameter of the non-volatile memory. Improved efficiency and reduced power consumption is also achieved by adapting the order in which the hypotheses for the read threshold voltages are scanned by the controller.

Figure 1:
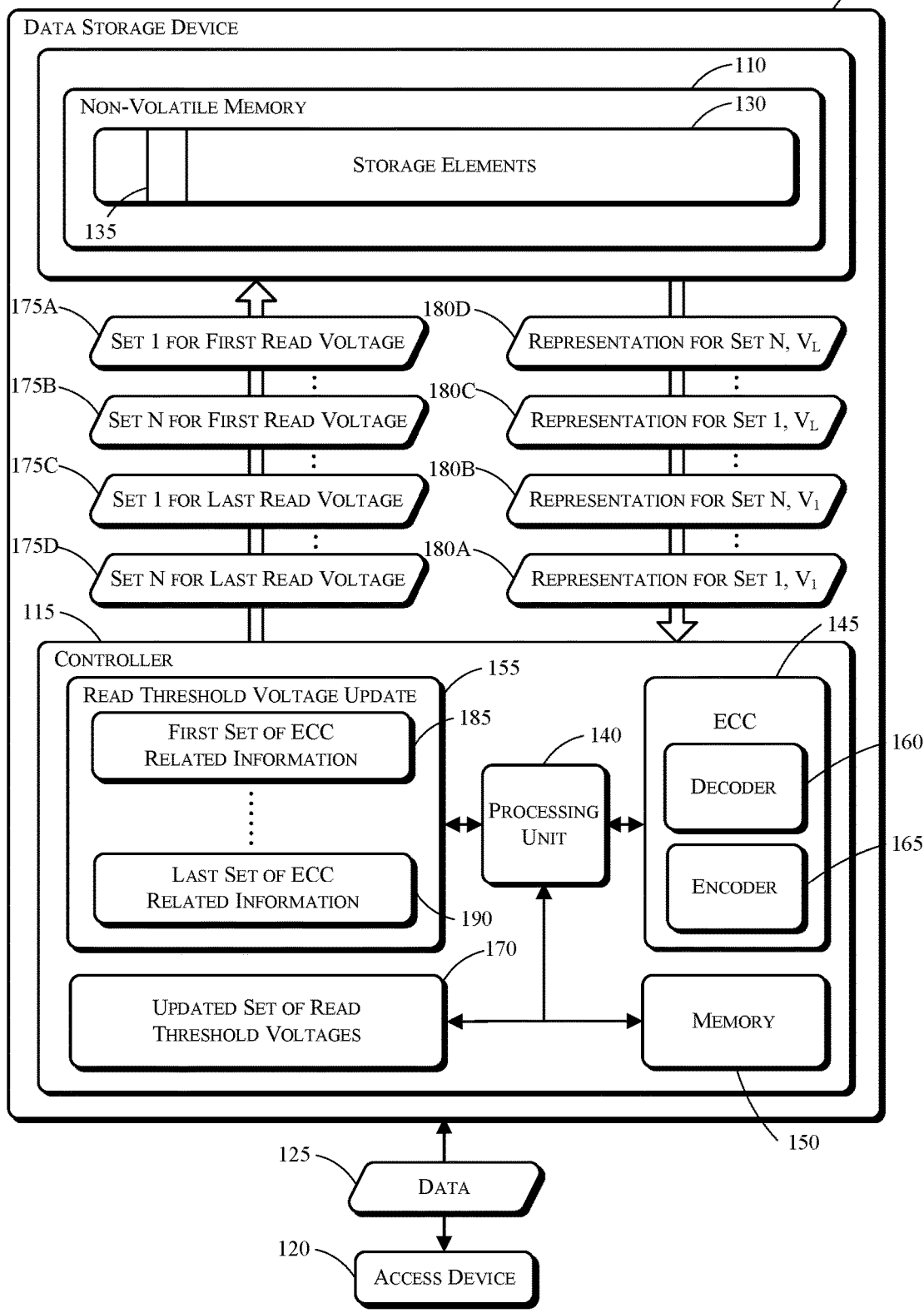
FIG. 1 illustrates a system including a data storage device and a controller that executes a read threshold voltage calibration process.

FIG. 1 illustrates a system 100 that includes a data storage device 105. The data storage device 105 is a flash memory device. In some embodiments, the data storage device 105 is, for example, a Secure Digital SD® card, a microSD® card, or another similar type of data storage device. The data storage device 105 includes a non-volatile memory 110 and a controller 115. The data storage device 105 is coupled or connected to an access device 120 (e.g., a host device).

The access device 120 is configured to provide data 125 (e.g., user data) to the data storage device 105 to be stored at the non-volatile memory 110. The access device 120 is also configured to request data to be read from the non-volatile memory 110. The access device 120 is, for example, a smart phone, a music player, a video player, a gaming console, an e-book reader, a personal digital assistance, a tablet, a notebook computer, or another similar device. The access device 120 communicates with the data storage device 105 using a memory interface that enables reading from the non-volatile memory 110 and writing to the non-volatile memory 110 using any suitable communication protocol. Suitable communication protocols include, for example, the Universal Flash Storage ("UFS") Host Controller Interface specification, the Secure Digital ("SD") Host Controller specification, etc.

The non-volatile memory 110 of the data storage device 105 is coupled to the controller 115. In some implementations, the non-volatile memory 110 is NAND flash memory. The non-volatile memory 110 includes a representative group of storage elements 130. The storage elements correspond to, for example, a word line or page of an MLC flash memory. The group of storage elements 130 includes a representative storage element 135. In some implementations, the representative storage element 135 is an MLC flash memory cell, such as a 4BPC flash memory cell. In other implementations, the storage element 135 is a single level cell ("SLC") flash memory cell, a two bits per cell ("2BPC") flash memory cell, a three bits per cell ("3BPC") flash memory cell, or a flash memory cell having a larger number of bits per cell (e.g., between five and ten bits per cell).

The controller 115 is configured to send data to, and receive data and instructions from, the access device 120. The controller 115 is also configured to send data and commands to, and receive data from, the non-volatile memory 110. As an illustrative example, the controller 115 is configured to send data and a write command to instruct the non-volatile memory 110 to store data in a particular memory location in the non-volatile memory 110. The controller 115 is also configured to send a read command to the non-volatile memory 110 to read data from a particular memory location in the non-volatile memory 110.

The controller 115 includes a processing unit or processor 140 (e.g., a microprocessor, a microcontroller, a field-programmable gate array ["FPGA"] semiconductor, an application specific integrated circuit ["ASIC"], or another suitable programmable device), an error-correcting code ("ECC") module 145, a non-transitory computer readable medium or memory 150 (e.g., including random access memory ["RAM"] and read only memory ["ROM"]), and a read threshold voltage update module 155. The processing unit 140 is operatively connected to the various modules within the controller 115 and data storage device 105. For example, firmware is loaded in a ROM of the memory 150 as computer executable instructions. Those computer executable instructions are capable of being retrieved from the memory 150 and executed by the processing unit 140 to control the operation of the controller 115 and perform the processes described herein (e.g., read threshold voltage calibration). In some implementations, one or more modules of the controller 115 correspond to separate hardware components within the controller 115. In other implementations, one or more modules of the controller 115 correspond to software stored within the memory 150 and executed by the processing unit 140. The controller 115 is illustrated in FIG. 1 in a simplified form. One skilled in the art would recognize that a controller for a non-volatile memory would include additional modules or components other than those specifically illustrated in FIG. 1.

Additionally, although the data storage device 105 is illustrated in FIG. 1 as including the controller 115 and modules for performing, for example, ECC, in other implementations the controller 115 is instead located within the access device 120 or is otherwise separate from the data storage device 105. As a result, the ECC and other flash translation layer ("FTL") operations that would normally be performed by the controller 115 (e.g., wear leveling, bad block management, data scrambling, garbage collection, address mapping, etc.) can be performed by the access device 120 or another device that connects to the data storage device 105.

The ECC module 145 is configured to receive data to be stored in the non-volatile memory 110. The ECC module 145 is configured to encode data using an ECC encoding scheme. In some implementations, the ECC encoding scheme is a Reed Solomon encoding scheme, a Bose-Chaudhuri-Hocquenghem ("BCH") encoding scheme, a low-density parity check ("LDPC") encoding scheme, or another suitable encoding scheme. The ECC module 145 includes a decoder 160 and an encoder 165. The decoder 160 is configured to decode data that is read from the non-volatile memory 110. The decoder 160 is configured to detect and correct bit errors that are present in the data read from the non-volatile memory 110. The decoder 160 corrects bit errors present in the data read from the non-volatile memory up to an error correction capability of the implemented ECC scheme.

The memory 150 is configured to store data used by the controller 115 during operation (e.g., during modification of a decode parameter based on one or more error counts). In some embodiments, the memory 150 stores bit error data that can be used during a read threshold voltage calibration process.

The read threshold voltage update module 155 is configured to generate an updated set of read threshold voltages 170. The updated set of read threshold voltages 170 is generated based on ECC information related to multiple representations of the data stored in a flash memory cell. In some implementations, the updated set of read threshold voltages 170 can be stored, for example, temporarily in one or more registers associated with the processing unit 140. In other implementations, the updated set of read threshold voltages 170 can be stored, for example, more permanently the memory 150. The multiple representations of the data stored in a flash memory cell result from adjusting a read threshold voltage used to read the data stored in the flash memory cell. A conventional read calibration process for an MLC flash memory cell is described illustratively with respect to a 3BPC flash memory cell.

Figure 2A:
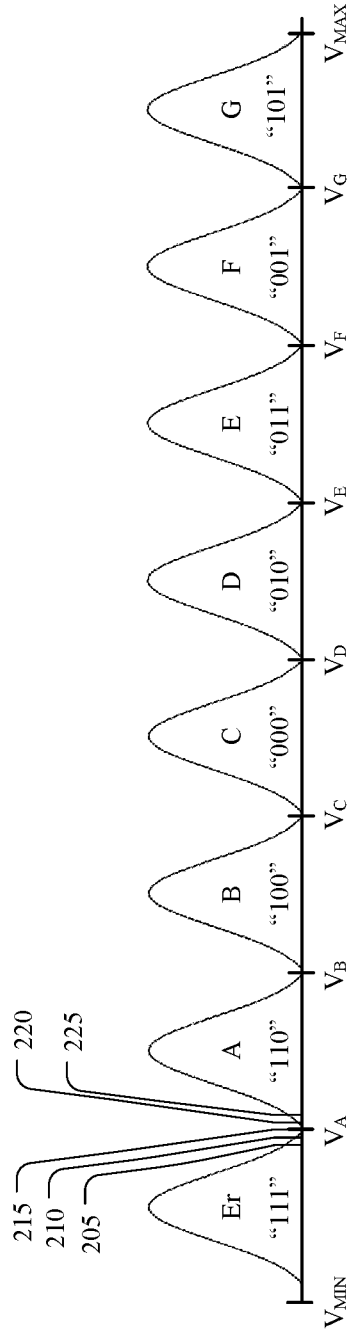
FIG. 2A illustrates hypotheses related to conventional read threshold voltage calibration of a first read threshold voltage for a three bits per cell ("3BPC") flash memory.

With reference to FIG. 2A, a first graph 200 illustrates a distribution of storage element states. The values correspond to eight distinct states of the 3BPC implementation: Erase ("Er"), A, B, C, D, E, F, and G. By way of comparison, a 4BPC can be represented by sixteen distinct states: 0, 1, 2, 3, 4, 5, 6, 7, 8, 9, A, B, C, D, E, and F (see, for example, FIG. 3). A set of read threshold voltages define the boundaries between the states of the 3BPC implementation. The values for the read threshold voltages are identified in FIG. 2A as $V_A$, $V_B$, $V_C$, $V_D$, $V_E$, $V_F$, and $V_G$. The read threshold voltages are used by the controller 115 to determine a programmed state of the storage element 135. Determining the state of the storage element 135 includes, for example, applying the read threshold voltage, $V_A$, to a word line of the group of storage elements 130. Applying the read threshold voltage, $V_A$, to the word line activates storage elements in the word line having threshold voltages that are less than the read threshold voltage, $V_A$. Storage elements having threshold voltages greater than the read threshold voltage, $V_A$, are not activated.

However, storage elements that are originally programmed to a particular state can experience voltage shifts that cause the threshold voltages between states of the storage element to change. For example, some storage elements originally set to the Er state may experience a voltage shift that causes the threshold voltage of the storage element to be greater than the read threshold voltage, $V_A$. Attempting to read data from the storage element using the original read threshold voltage, $V_A$, will result in bit errors because the storage elements are read as corresponding to state A (i.e., a bit sequence of "110") instead of corresponding to state Er (i.e., a bit sequence of "111"). Similarly, storage elements can experience voltage shifts that cause the threshold voltages to be less than read threshold voltage, $V_A$, which can also result in bit errors.

Figure 2B:
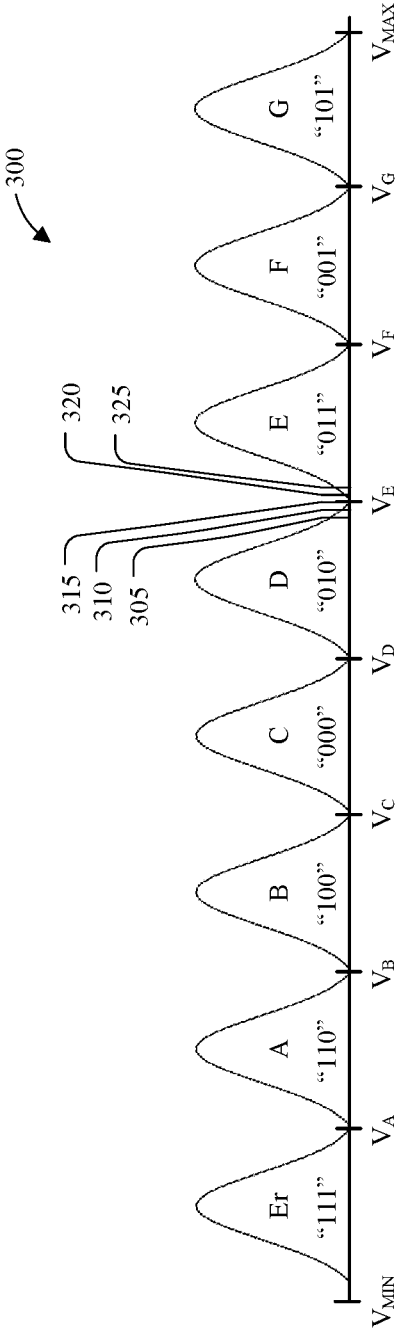
FIG. 2B illustrates hypotheses related to conventional read threshold voltage calibration of a second read threshold voltage for a 3BPC flash memory.

As a result of these voltage shifts, the read threshold voltage update module 155 can be configured to adjust, for example, the read threshold voltage, $V_A$, in an attempt to reduce the number of bit errors that result from voltage shift. With continued reference to FIG. 2A, the read threshold voltage update module 155 would be configured to assign the read threshold voltage, $V_A$, with a first hypothesis 205, a second hypothesis 210, a third hypothesis 215, a fourth hypothesis 220, and then a fifth hypothesis 225. As these hypotheses are being assigned, the remaining read threshold voltages (i.e., $V_B$, $V_C$, etc.) can remain unchanged. In a 3BPC flash memory cell, for example, read threshold voltages $V_B$ and $V_E$ could remain unchanged while the hypotheses 205-225 are scanned. Each resulting set of read threshold voltages is used to read the data from the storage element 135 (e.g., perform a scan). FIG. 2B illustrates a second graph 300 and multiple hypotheses 305, 310, 315, 320, and 325 associated with a different read threshold voltage (i.e., read threshold voltage, $V_E$).

With reference once again to FIG. 1, the read threshold voltage update module 155 is configured to generate a first set of read threshold voltages 175A for a first read threshold voltage (e.g., hypothesis 205 for read threshold voltage $V_A$ and preset read threshold voltage values for $V_B$ and $V_E$). The read threshold voltage update module 155 is configured to generate up to N sets of read threshold voltages 175B for the first read threshold voltage. These sets of read threshold voltages 175A, 175B correspond to the hypotheses 205-225 described above with respect to FIG. 2A and preset values for the other read threshold voltages. Similarly, the read threshold voltage update module 155 is configured to generate a first set of read threshold voltages 175C for a last read threshold voltage. The read threshold voltage update module 155 is configured to generate up to N sets of read threshold voltages 175D for the last read threshold voltage (e.g., a third read threshold voltage). These sets of read threshold voltages 175C, 175D correspond, for example, to the hypotheses 305-325 described above with respect to FIG. 2B.

The read threshold voltage update module 155 sends each set of read threshold voltages sequentially to the non-volatile memory 110. Each generated set of read threshold voltages sent to the non-volatile memory 110 can be used to read a corresponding representation 180A, 180B, 180C, and 180D of data from storage element 135. In response to each of the representations 180A-180D, the decoder 160 is configured to generate an associated set of ECC related information (e.g., a first set of ECC related information 185 for the first read threshold voltage). The first set of ECC related information 185 can include syndrome values for each of the representations 180A-180B. The read threshold voltage update module 155 is configured to receive or access the first set of ECC related information 185 to determine or estimate a number of bit errors or BER for each of the returned representations 180A-180B. In other implementations, the read threshold voltage update module 155 determines a different ECC metric (e.g., number of corrected errors, a length of time to decode, a syndrome weight [i.e., the number of unsatisfied ECC parity-check equations], a number of bit flips detected during decoding, etc.).

The read threshold voltage update module 155 uses the first set of ECC related information 185 to select the hypothesis (e.g., one of hypotheses 205-225) that results in the most desirable value of an ECC related metric. For example, the read threshold voltage update module 155 can identify the representation 180A-180B having the lowest estimated or actual number of bit errors in the data (e.g., compared to the estimated or actual number of bit errors for representations associated with hypotheses 205-225). In some implementations, the read threshold voltage update module 155 can identify the representation 180A-180B having a minimal BER. In other implementations, the read threshold voltage update module 155 can identify the representation 180A-180B based on ECC power consumption, latency, minimum throughput, syndrome weight, or another ECC related metric. The read threshold voltage update module 155 is configured to repeat this process for each of the representations 180C to 180D for the last read threshold voltage and based on a last set of ECC related information 190.

Figure 3:
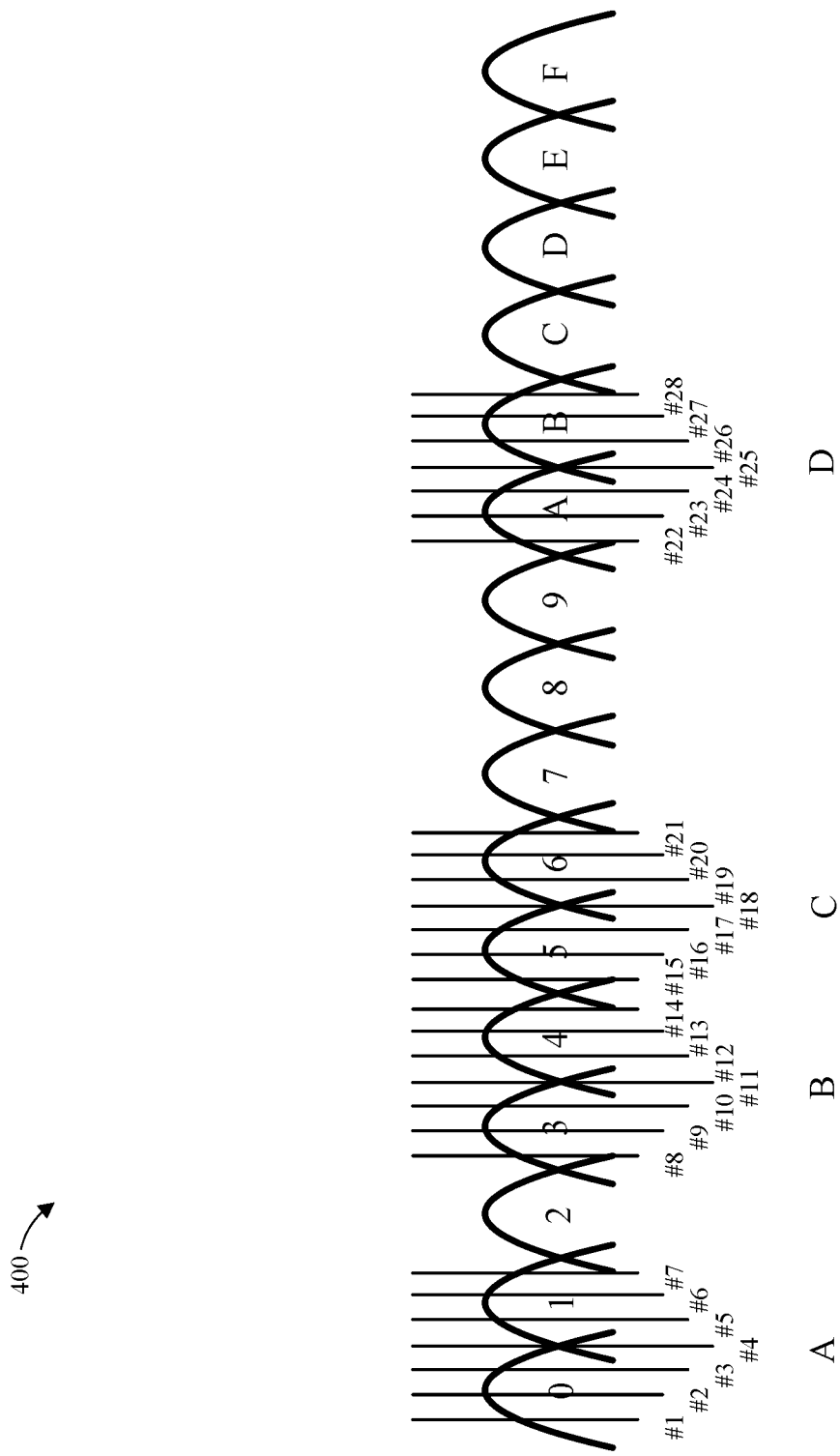
FIG. 3 illustrates hypotheses related to the read threshold voltage calibration of a four bits per cell ("4BPC") flash memory page.

The repetitive nature of read threshold voltage calibration can be illustrated with reference to FIG. 3. FIG. 3 illustrates the application of a conventional read threshold voltage calibration technique to a lower 4BPC flash memory cell page that includes four read thresholds. The four read thresholds are identified as A, B, C, and D. The conventional read threshold voltage calibration technique begins with read voltage A. The controller 115 scans through each of read threshold voltages 1-7. The set of read threshold voltages associated with a particular read threshold (e.g., read threshold voltages 1-7 associated with read threshold A) can be collectively referred to as a comb of read threshold voltages that can be scanned during read threshold calibration. While read threshold voltages 1-7 are being scanned, voltages for read threshold B, C, and D remain constant (e.g., set to middle read threshold voltages 11, 18, and 25, respectively, of their scanning combs). Scanning each of the read threshold voltages 1-7 for read threshold A involves the controller 115 retrieving representations from the non-volatile memory 110, as described above with respect to FIG. 1.

After each of the read threshold voltages 1-7 has been scanned, for example, the minimum syndrome weight for the comb of read threshold voltages can be compared to a threshold syndrome weight, $SW_{TH}$. When the minimum syndrome weight for the comb of read threshold voltages is still higher than the threshold syndrome weight, $SW_{TH}$, the controller 115 changes the read voltage threshold for read voltage B from read threshold voltage 11 to read threshold voltage 12 according to a preset scanning order. Such a preset scanning order typically involves moving the read threshold voltages to a read threshold voltage adjacent to a current read threshold voltage. In FIG. 3, the preset read threshold voltage scanning order for read voltage B is, for example, as follows: 11, 12, 10, 13, 9, 14, and 18. After the controller 115 moves the read threshold voltage from read threshold voltage 11 to read threshold voltage 12, the controller 115 rescans the read threshold voltages 1-7 for read voltage A. This process for modifying read threshold voltages is repeated according to the preset order until a minimum syndrome weight from a scan is less than the threshold syndrome weight, $SW_{TH}$.

The repetitive scanning and sequential adjustment of read threshold voltages according to this conventional read threshold calibration technique is particularly problematic when a read threshold D is a significant cause of a high syndrome weight. For example, the read voltage threshold voltage for read threshold D may not be modified until approximately $6\times(7^3)$ hypotheses have been scanned. This results in a large latency from the read threshold calibration process. Similar large latencies can be experienced for any preset read threshold voltage scanning order.

Figure 4:
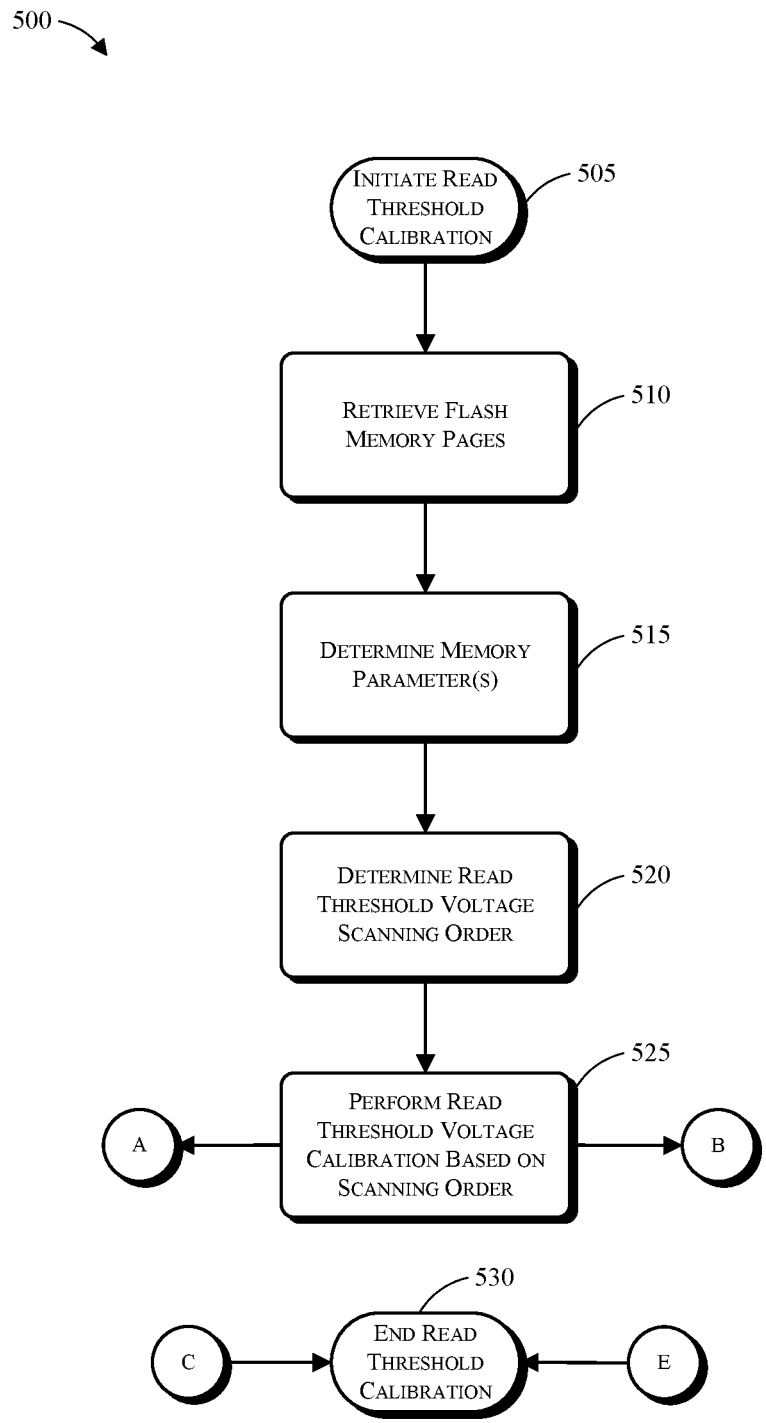
FIG. 4 is a process for performing read threshold calibration.

FIG. 4 illustrates an adaptive read threshold voltage calibration process 500 that improves upon conventional read threshold voltage calibration processes. The process 500 improves upon conventional read threshold voltage calibration processes by adapting a read threshold sequence or scanning order of hypotheses based on one or more memory parameters. By adapting the scanning order of hypotheses for read threshold voltage calibration, the controller 115 can more efficiently calibrate the read threshold voltages.

The process 500 begins with the initiation of read threshold voltage calibration (STEP 505). As described above, read threshold voltage calibration is performed by the controller 115. At STEP 510, the controller 115 retrieves one or more flash memory pages from the non-volatile memory 110. For example, 4BPC flash memory cells have four associated flash memory pages. When reading data from the 4BPC flash memory cells, the controller 115 will retrieve, for example, four flash memory pages associated with the flash memory cells. After the controller 115 has retrieved the flash memory pages, the controller 115 determines one or more memory parameters associated with the pages of flash memory that were retrieved (STEP 515). The one or more memory parameters include, for example, the structure of the memory 110, the condition of the memory 110, and the operational mode of the memory 110. Each of these memory parameters can affect the ability of the controller 115 to efficiently and effectively read data from flash memory cells. Because these parameters can affect the expected positions of the states of a flash memory cell (see, e.g., FIGS. 2A and 2B), the controller 115 considers these parameters when determining a scanning order for read threshold voltage calibration.

Structural characteristics of flash memory that can affect read threshold voltage calibration include the physical structures of individual memory cells, word lines, flash memory pages, flash memory blocks, etc. For example, word lines at the edge of a flash memory block can behave differently than other word lines in the flash memory block (e.g., middle word lines in the flash memory block).

Conditions of flash memory that can affect read threshold voltage calibration include the temperature of the memory (e.g., a word line) when programmed, the temperature of the memory when reading, and memory data retention. For example, data retention could move a cell voltage distribution ("CVD") to the left in FIGS. 2A and 2B and reduce a read threshold voltage. As another example, variations between a temperature of a flash memory cell when data is written to the flash memory cell (i.e., programming temperature) and a temperature when data is read from the flash memory cell (i.e., reading temperature) can result in the flash memory cell's read threshold voltages shifting. Shifts can occur in both temperature directions (i.e., higher temperatures or lower temperatures when compared to programming temperature). Temperature variations are particularly problematic for flash memory cells because each flash memory cell can potentially exhibit different shifts in threshold voltages due to each flash memory cell having a distinct cross temperature coefficient.

The operational modes of flash memory that can affect read threshold voltage calibration include read failure recover (e.g., when decoding fails) and read threshold voltage calibration. Read threshold voltage calibration can either be ongoing (e.g., performed at set intervals) or the result of a global condition change (e.g., temperature change, increase in BER, etc.). For example, data retention can shift the CVDs of flash memory cells to the left (i.e., lowering threshold voltages).

By incorporating one or more of these memory parameters into the read threshold voltage calibration process, the controller 115 is able to determine or select a scanning order or sequence of read threshold voltages that more efficiently calibrates the read threshold voltages. As a result, at STEP 520, the controller 115 uses the memory parameters from STEP 515 to determine a read threshold voltage scanning order. The read threshold scanning order determined at STEP 520 corresponds to the particular scanning order and read threshold voltages that will later be set when read threshold calibration is performed by the controller 115. In some implementations, the controller 115 also incorporates the results of prior read threshold voltage calibrations and considers a probability that read threshold voltages will shift for similar or identical memory parameters.

The read threshold voltage scanning order includes both the order in which the read thresholds will be calibrated and the order in which the read threshold voltages within a comb of read threshold voltages for particular read thresholds will be calibrated. For example, the controller 115 determines an order that read thresholds A, B, C, and D in FIG. 3 will be calibrated. Possible orders for the calibration of read thresholds A, B, C, and D include [A, B, C, D], [B, C, D, A], [B, A, C, D], [A, D, B, C], etc. Unlike conventional read threshold voltage calibration processes, which always follow the [A, B, C, D] order, the determined read threshold voltage scanning order can have a different order. For example, with reference to FIG. 3, the read threshold voltages for read threshold A have the lowest voltage values among the read thresholds A, B, C, and D. Each of read thresholds B, C, and D correspond to combs of read threshold voltages that have higher voltage values than the voltage values for read threshold A's comb of read threshold voltages. One of the read thresholds B, C, or D can be determined to be the first read threshold in a read threshold voltage scanning order. As a result, the first read threshold in a determined read threshold voltage scanning order will have read threshold voltages with higher voltage values than at least one of the other read thresholds in the scanning order for the read thresholds (e.g., a sequence of [B, A, C, D]).

The order in which the read threshold voltages within a comb of read threshold voltage can similarly take a number of forms. For example, with reference to FIG. 3, the comb of read threshold voltages for read threshold B could be set to [12, 13, 14, 11, 10, 9, 8]. The scanning order of the read threshold voltages in each comb of read threshold voltages can be set in a similar manner. In some implementations, the controller 115 sets a scanning order for a comb of read threshold voltages differently depending upon whether the read threshold is the current read threshold (i.e., the read threshold being scanned) or a non-current read threshold (i.e., a read threshold not being scanned). For example, with reference to FIG. 3, when read threshold A is the current read threshold, the comb of read threshold voltages is scanned [1, 2, 3, 4, 5, 6, 7]. However, when read threshold A is a non-current read threshold, the comb of read threshold voltages can be scanned [4, 5, 3, 6, 2, 7, 1]. A circumstance where the read threshold voltages in a comb could be scanned in a different order depending upon whether a read threshold is a current or non-current read threshold occurs in a process 600 described below (see, e.g., STEP 625). In some implementations, the determined scanning order can be applicable to more than the one or more flash memory pages retrieved by the controller 115 from the non-volatile memory 110 for determining the scanning order. In such implementations, additional flash memory pages can be retrieved by the controller 115 from the non-volatile memory 110 without determining a new scanning order, and read threshold calibration can be performed for these additional flash memory pages based on the determined scanning order.

Determining the scanning order at STEP 520 can also include determining various settings related to the read threshold calibration process. For example, the controller 115 can set a maximum number of iterations of a process that will be performed (see, e.g., process 700 and STEP 740). The controller 115 can also set target ECC metrics (e.g., syndrome weight threshold, maximum BER, etc.). For example, a syndrome weight threshold value may be set higher when recovering from a read error or lower when attempting to reduce overall BER of a flash memory block. In some implementations, when recovering from a read error, a syndrome weight threshold value may be used only for the flash memory page that is in error. However, when attempting to reduce overall BER of a flash memory block, a syndrome weight threshold value may be used for all flash memory pages in the flash memory block.

After the controller 115 has determined a scanning order at STEP 520, the controller performs read threshold voltage calibration based on the determined scanning order (STEP 525). The read threshold voltage calibration can be performed in a variety of ways based on the determined scanning order. CONTROL SECTION A of the process 500 relates to a first process 600 for performing read threshold voltage calibration. CONTROL SECTION B of the process 500 relates to a second process 700 for performing read threshold voltage calibration. Each of the read threshold voltage calibration processes 600, 700 is described in greater detail below with reference to FIGS. 5 and 6, respectively. After either of the read threshold voltage calibration processes 600, 700 has concluded, the adaptive read threshold voltage calibration process 500 ends (STEP 530).

Figure 5:
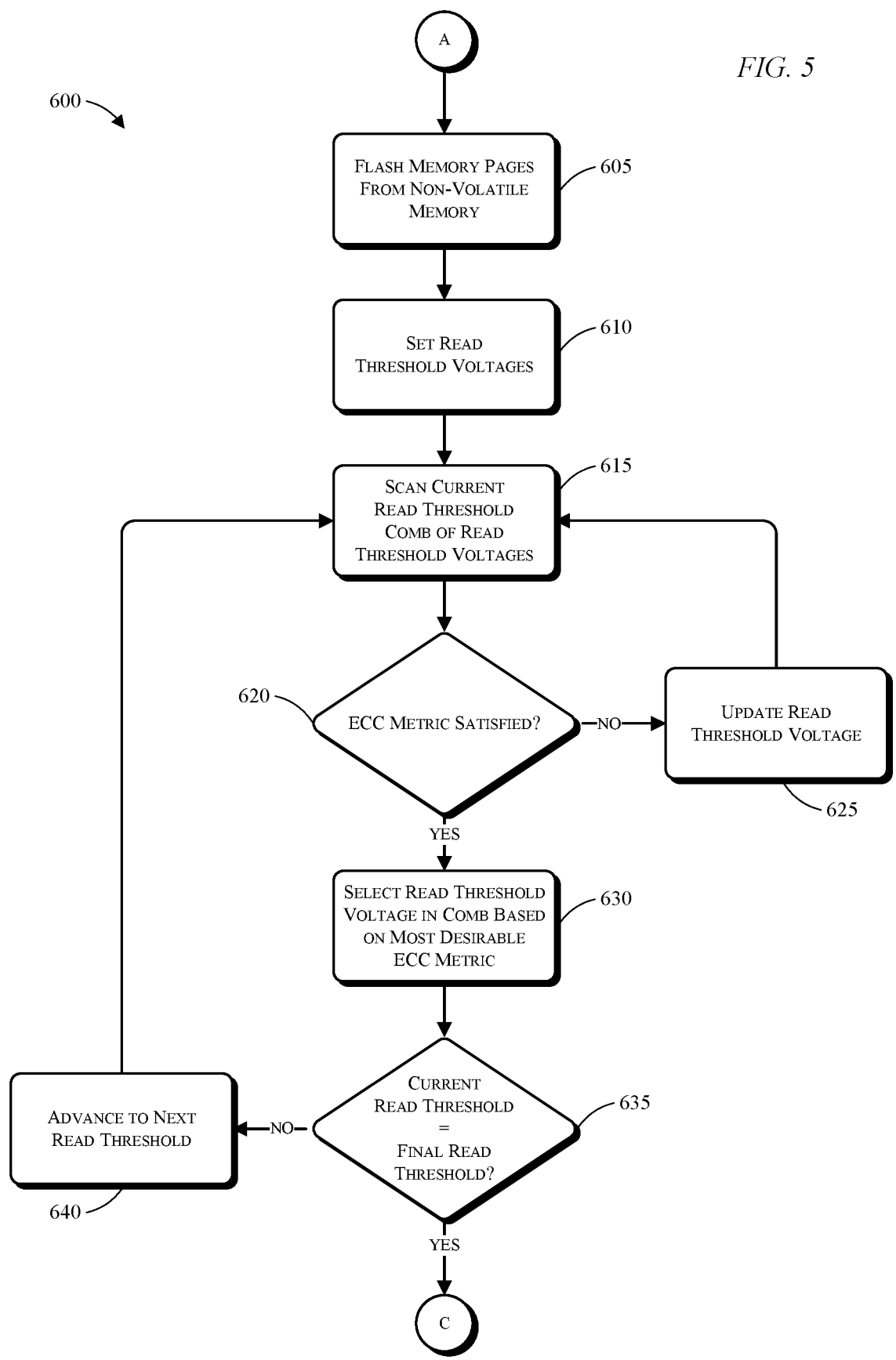
FIG. 5 is a process for performing read threshold voltage calibration

The first process 600 for performing read threshold voltage calibration is shown in and described with respect to FIG. 5. The process 600 begins with flash memory pages retrieved from the non-volatile memory 110 by controller 115 (STEP 605). The flash memory pages can either be the flash memory pages previously retrieved by the controller 115 at STEP 510 of process 500 or newly retrieved flash memory pages. For example, when the determined scanning order is applicable to a large number of flash memory pages, the controller 115 can retrieve new flash memory pages from the non-volatile memory 110. When the determined scanning order is applicable only to the flash memory pages used to determine the scanning order at STEP 520 of process 500, the controller 115 does not retrieve additional flash memory pages. Therefore, STEP 605 can be optional within the process 600 depending upon the applicability of the determined read threshold voltage scanning order. The read threshold voltages are then set based on the determined scanning order from STEP 520 in FIG. 4 (STEP 610). Examples for how the controller 115 can choose to set the read threshold scanning order are provided above (e.g., [B, D, A, C]; [A, C, D, B], etc.). In some implementations, the starting read threshold voltage for each read threshold can be set to a center position (i.e., read threshold voltages 4, 11, 18, and 25 from FIG. 3). In other implementations, a different read threshold voltage from the combs of read threshold voltages can be selected as a starting read threshold voltage. Regardless of the precise order in which the read thresholds are scanned, the process 600 scans through the determined order of read threshold voltages sequentially (i.e., starting with the comb of read threshold voltages for one of read thresholds A, B, C, or D) at STEP 615. For example, with reference to FIG. 3, the comb of read threshold voltages for read threshold B incudes read threshold voltage hypotheses 8, 9, 10, 11, 12, 13, and 14.

After scanning the comb of read threshold voltages for the current read threshold is complete, the controller 115 determines whether one or more ECC metric has been satisfied (STEP 620). As described above with respect to FIG. 1, ECC metrics can include a determined or estimated number of bit errors, BER, number of corrected errors, a length of time to decode, a syndrome weight, a number of bit flips detected during decoding, etc. For example, in some implementations, satisfying the ECC metric at STEP 620 can include determining that a syndrome weight is less than or equal to a syndrome weight threshold value. In other implementations, satisfying the ECC metric at STEP 620 can include BER being less than or equal to a BER threshold value. Regardless of the particular ECC metric that is selected, the process 600 will continue to scan read threshold voltages until the ECC metric is satisfied at STEP 620.

When, for example, the ECC metric is syndrome weight and the syndrome weight is less than or equal to a syndrome weight threshold value, the combs of the read thresholds A, B, C, and D can be presumed to be independent of one another (i.e., changing the read threshold voltage for the comb of one read threshold does not have any influence on the read threshold voltages for the combs of the other read thresholds). However, when the syndrome weight is greater than the syndrome weight threshold value, the combs of the different read thresholds are dependent. As a result of this dependence, changing a read threshold voltage for one comb will influence the read threshold voltages of the other combs. Therefore, to reduce the syndrome weight when a current comb of read threshold voltages is being scanned, a read threshold voltage for one of the other, non-current read thresholds can be modified. This modification to one of the other, non-current read thresholds can then affect the syndrome weights when the comb of read threshold voltages for the current read threshold is scanned. The order in which these other, non-current read thresholds are modified is set by the controller 115 at step 520 in FIG. 4.

Specifically, at STEP 620, when the ECC metric is not satisfied, the controller 115 updates the read threshold voltage (STEP 625). Updating the read threshold voltage includes updating a read threshold voltage for a read threshold other than the current read threshold. For example, when the current read threshold is read threshold A, the controller modifies a read threshold voltage of one of read thresholds B, C, or D, depending upon where the controller 115 is in the determined scanning order. After the controller 115 updates the read threshold voltage for one of the read thresholds other than the current read threshold being scanned, the controller 115 again scans the current read threshold voltage comb (e.g., for read threshold A) (STEP 615). This iterative process of changing one of the non-current read threshold voltages and rescanning the current comb of read threshold voltages is repeated until the ECC metric is satisfied at STEP 620.

When the ECC metric is satisfied at STEP 620, the controller 115 sets the read threshold voltage for the current read threshold to the read threshold voltage that produced the most desirable ECC metric (e.g., minimum syndrome weight, minimum BER, etc.) (STEP 630). Following STEP 630, the controller 115 determines whether the current read threshold is the final read threshold (STEP 635). For example, if the scanning order of read thresholds was set by the controller to be [B, D, A, C], read threshold C is the final read threshold. If, at STEP 635, the current read threshold is the final read threshold, the process 600 returns to CONTROL SECTION C in FIG. 4 and read threshold voltage calibration is complete. If, at STEP 635, the current read threshold is not the final read threshold, the controller 115 advances to the next read threshold (STEP 640) and returns to STEP 615 to continue scanning for the new read threshold.

The process 600 could be used to implement the conventional read threshold voltage calibration described previously. For example, if the determined scanning order is selected as [A, B, C, D] and starting read threshold voltages are set to comb center positions (e.g., 4, 11, 18, 25 in FIG. 3), the process 600 would operate in the same manner as the conventional read threshold voltage calibration process and would exhibit the same efficiency and latency problems associated with the conventional read threshold voltage calibration process. However, when the controller 115 determines a scanning order that is different than the conventional [A, B, C, D] read threshold scanning order with starting read threshold voltages set to comb center positions, the process 600 will be capable of demonstrating a more efficient read threshold calibration process when compared to the conventional read threshold calibration process.

Figure 6:
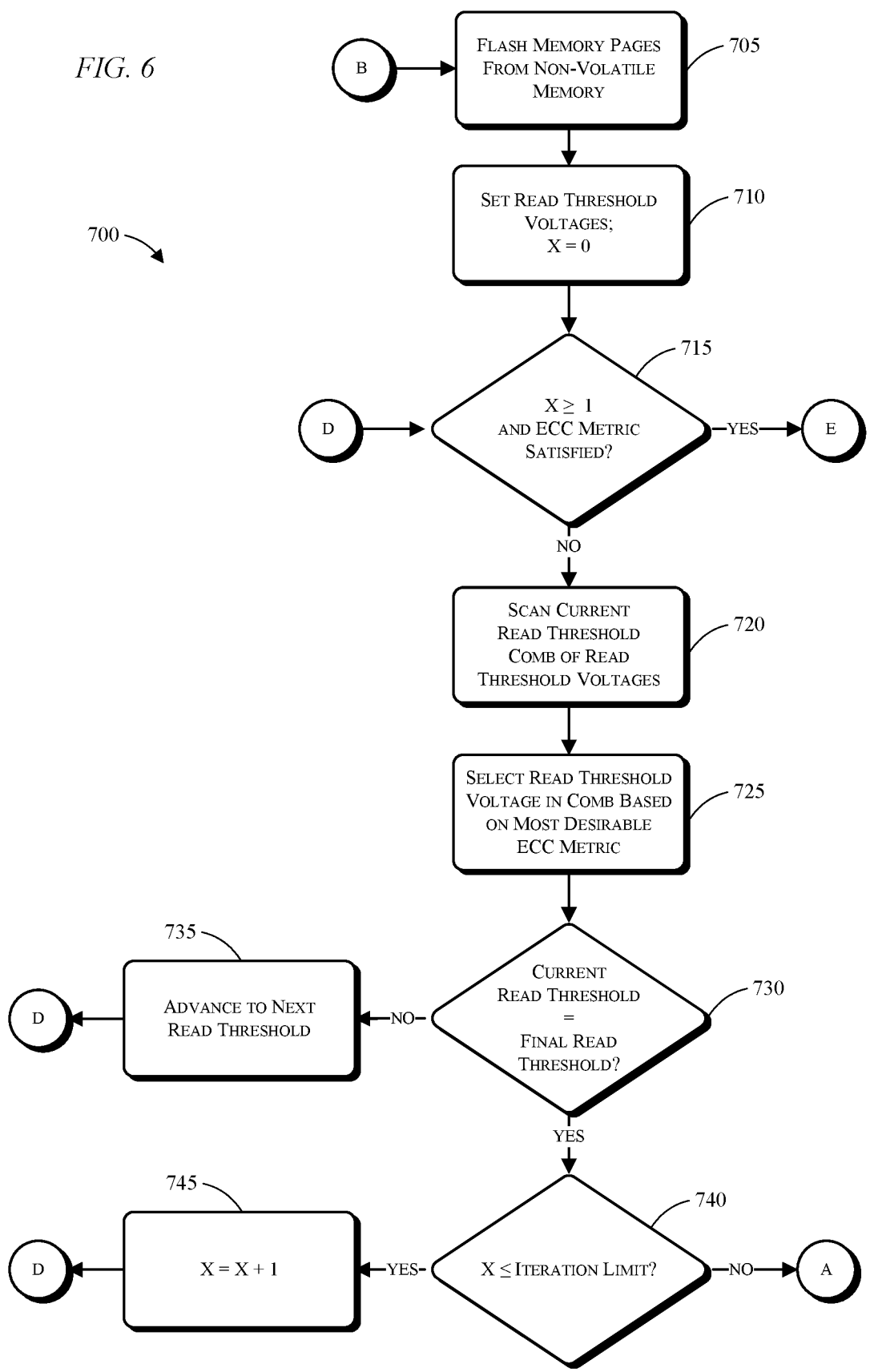
FIG. 6 is a process for performing read threshold voltage calibration.

The second process 700 for performing read threshold voltage calibration is shown in and described with respect to FIG. 6. Although the process 700 is illustrated as being within the adaptive read threshold voltage calibration process 500, the process 700 can alternatively be implemented in the controller 115 separate from the process 500. In such implementations, the read threshold calibration order would not be set based on the memory parameters in STEP 520 of the process 500. In such implementations, the process 700 is still capable of providing improved efficiency over the conventional read threshold voltage calibration process. However, the process 700 may provide further improvements in efficiency over the conventional read threshold voltage calibration process when the process 700 is implemented such that the controller 115 determines a read threshold voltage scanning order based on memory parameters at STEP 520 of process 500.

The process 700 begins with flash memory pages retrieved from the non-volatile memory 110 by controller 115 (STEP 705). The flash memory pages can either be the flash memory pages previously retrieved by the controller 115 at STEP 510 of process 500 or newly retrieved flash memory pages. For example, when the determined scanning order is applicable to a large number of flash memory pages, the controller 115 can retrieve new flash memory pages from the non-volatile memory 110. When the determined scanning order is applicable only to the flash memory pages used to determine the scanning order at STEP 520 of process 500, the controller 115 does not retrieve additional flash memory pages. Therefore, STEP 705 can be optional within the process 700 depending upon the applicability of the determined read threshold voltage scanning order. The read threshold voltages are then set based on, for example, the determined scanning order from STEP 520 in FIG. 4, and an iteration counter, X, is set equal to zero (STEP 710). Examples for how the controller 115 can choose to set the read threshold scanning order are provided above (e.g., [B, D, A, C]; [A, C, D, B], etc.). After the read threshold voltages for the read thresholds have been set, the controller 115 determines whether the iteration counter, X, has a value greater than or equal to one and whether an ECC metric has been satisfied (STEP 715). As described above with respect to FIG. 1, ECC metrics can include a determined or estimated number of bit errors, BER, number of corrected errors, a length of time to decode, a syndrome weight, a number of bit flips detected during decoding, etc. For example, in some implementations, satisfying the ECC metric at STEP 715 can include determining that a syndrome weight is less than or equal to a syndrome weight threshold value. In other implementations, satisfying the ECC metric at STEP 715 can include BER being less than or equal to a BER threshold value. Regardless of the particular ECC metric that is selected, the process 700 will continue to scan read threshold voltages until the iteration counter, X, is greater than or equal to one and the ECC metric is satisfied at STEP 720.

The process 700 then scans through the determined order of read threshold voltages for the current read threshold (e.g., the comb of read threshold voltages for the first of read thresholds A, B, C, or D) at STEP 720. For example, with reference to FIG. 3, the comb of read threshold voltages for read threshold B includes read threshold voltage hypotheses 8, 9, 10, 11, 12, 13, and 14. If read threshold B was determined to be the first read threshold to be scanned, each of the threshold voltage hypotheses related to read threshold B would be scanned. After scanning each of the read threshold voltage hypotheses for the first read threshold, the controller 115 selects the hypothesis for the first read threshold that produces the most desirable ECC metric (e.g., lowest BER, lowest syndrome weight, etc.) (STEP 725). The most desirable ECC metric does not necessarily correspond to an ECC metric below a threshold value (e.g., a syndrome weight below a syndrome weight threshold value). Rather, the selected read threshold voltage corresponds, for example, to an improvement in the ECC metric.

Following STEP 725, the controller determines whether the current read threshold is the final read threshold (STEP 730). For example, if the scanning order of read thresholds was set by the controller to be [B, D, A, C], read threshold C is the final read threshold. If, at STEP 730, the current read threshold is not the final read threshold, the controller 115 advances the process 700 to the next read threshold (STEP 735), and the process 700 returns to STEP 715 where the iteration counter, X, is again evaluated to see if the iteration counter's value is greater than or equal to one and the ECC metric is satisfied. If, at STEP 715, the iteration counter, X, and the ECC metric are not satisfied, the process 700 will continue with scanning the current read threshold comb of read threshold voltages (i.e., read threshold D in a sequence of [B, D, A, C]). The process 700 continues scanning the combs of read threshold values for each of the read thresholds once and selecting the read threshold voltage that produced the most desirable ECC metric. The controller 115 cycles through the read thresholds (e.g., [B, D, A, C]) in this manner repeatedly updating the read threshold voltage value of the comb of read threshold voltages. Eventually, at STEP 715, the iteration counter, X, will be greater than or equal to one and the ECC metric will be satisfied. When both of these conditions are satisfied at STEP 715, the process 700 returns to CONTROL SECTION E in FIG. 4 and read threshold voltage calibration is complete.

Returning to STEP 730, when the current read threshold is the final read threshold, the controller 115 determines whether the iteration counter, X, has a value that is less than or equal to an iteration limit for the process 700 (STEP 740). When the iteration counter, X, is less than or equal to the iteration limit for the process 700, the iteration counter, X, is incremented (STEP 745) and the process 700 returns to STEP 715. Returning to STEP 715, the process 700 will again cycle through each of the read thresholds (e.g., [B, D, A, C]) and will update the read threshold voltage of each based on the most desirable ECC metric. In some implementations, the iteration limit for the process is ten. In other implementations the iteration limit is greater than or less than ten (e.g., between one and fifty). As a result, the process 700 updates the read threshold voltages for each of the read thresholds up to a number of times that equals the iteration limit, unless the iteration counter, X, is greater than or equal to one and the ECC metric is satisfied at STEP 715.

Returning to STEP 740, when the iteration counter, X, is not less than or equal to the iteration limit for the process 700, the process 700 returns to CONTROL SECTION A in FIG. 5 and the process 600 can be executed in an attempt to calibrate the read threshold voltages for the memory pages retrieved from the non-volatile memory 110.

In some implementations, the process 700 is unable to satisfy the conditions of STEP 715 (i.e., achieve a value for the iteration counter, X, of greater than or equal to one and satisfy an ECC metric). This can, for example, occur when the iteration counter has reached the iteration limit without the ECC metric being satisfied. Such a condition can occur when, for example, multiple of the read thresholds require calibration. When multiple read thresholds require calibration, the process 700 may increase the latency of the controller 115 during the read threshold voltage calibration process. As a result, the process 700 is most effective at improving the efficiency of the controller 115 when only one read threshold has shifted and requires calibration. When multiple read thresholds require calibration, the process 700 will return to COTNROL SECTION A and process 600 to complete the read threshold voltage calibration process. In some implementations, the controller 115 is able to predict that multiple read thresholds will require calibration (e.g., at STEP 515 and STEP 520 of process 500 in FIG. 4) and the process 600 is selected for performing read threshold voltage calibration.

The adaptive read threshold voltage calibration process 500, the first read threshold voltage calibration process 600, and the second read threshold voltage calibration process 700, alone and in combination, produce a more efficient read threshold voltage calibration for the controller 115 when compared to the conventional read threshold voltage calibration processes. For example, TABLE 1 below illustrates the reduced latency achieved by the combined operation of the processes 500, 600, and 700 (right column) in comparison to the conventional process (left column).

TABLE 1

READ THRESHOLD VOLTAGE CALIBRATION PROCESSING LATENCY

|  | Conventional | Adaptive |
|---|---|---|
| Two-Sigma Scenario | 100 μs | 70 μs |
| Pathological Case | 3 ms | 200 μs |

TABLE 1 illustrates the improved latency of a pathological case and a two-sigma scenario (rare), which is expected to occur in approximately 1% of cases. The pathological case could result in a very long runtime for the controller 115 to complete a conventional read threshold voltage calibration process. As shown in TABLE 1, processing latency is reduced in the two-sigma scenario by approximately 30% from 100 μs to 70 μs. In the pathological case, processing latency is reduced by over 90% from approximately 3 ms to 200 μs.

Thus, embodiments described herein provide, among other things, an adaptive read threshold voltage calibration process that provides advantages in both reduced latency and reduced power consumption when compared to prior read threshold calibration techniques. Various features and advantages are set forth in the following claims.

What is claimed is:

1. A device comprising:
a non-volatile memory; and
a controller coupled to the non-volatile memory, the controller including a non-transitory computer readable medium and a processor, the controller configured to:
retrieve, using the processor, a flash memory page from the non-volatile memory,
determine, using the processor, a read threshold voltage scanning order based on a memory parameter associated with the flash memory page, and
perform, using the processor, read threshold voltage calibration according to the read threshold voltage scanning order,
wherein the read threshold calibration scanning order includes a scanning order for a plurality of read thresholds, and wherein a first read threshold in the scanning order for the plurality of read thresholds corresponds to a comb of read threshold voltages having higher voltage values than at least one of the other read thresholds in the scanning order for the plurality of read thresholds.

2. The device of claim 1, the controller further configured to, when performing read threshold voltage calibration:
set read threshold voltages for each of a plurality of read thresholds based on the read threshold voltage scanning order,
scan a comb of read threshold voltages for a first of the plurality of read thresholds, the first of the plurality of read thresholds corresponding to the first read threshold in the read threshold voltage scanning order, and
select a read threshold voltage in the comb of read threshold voltages for the first of the plurality of read thresholds based on an error-correcting code ("ECC") metric.

3. The device of claim 2, the controller further configured to, when performing read threshold voltage calibration:
advance the read threshold voltage calibration to a second of the plurality of read thresholds after selecting the read threshold voltage in the comb of read threshold voltages for the first of the plurality of read thresholds,
scan a comb of read threshold voltages for the second of the plurality of read thresholds, the second of the plurality of read thresholds corresponding to the second read threshold in the read threshold voltage scanning order, and
select a read threshold voltage in the comb of read threshold voltages for the second of the plurality of read thresholds based on the ECC metric.

4. The device of claim 3, the controller further configured to, when performing read threshold voltage calibration:
advance the read threshold voltage calibration to a third of the plurality of read thresholds after selecting the read threshold voltage for the second of the plurality of read thresholds,
scan a comb of read threshold voltages for the third of the plurality of read thresholds, the third of the plurality of read thresholds corresponding to the third read threshold in the read threshold voltage scanning order, and
select a read threshold voltage in the comb of read threshold voltages for the third of the plurality of read thresholds based on the ECC metric.

5. The device of claim 4, wherein the ECC metric is a syndrome weight.

6. The device of claim 1, wherein the memory parameter is at least one selected from the group consisting of: a structural characteristic of the non-volatile memory, an operational mode of the controller, and a condition of the non-volatile memory.

7. A method for controlling read threshold voltage calibration, the method comprising:
retrieving, using a processor, a flash memory page from a non-volatile memory;
determining, using the processor, a read threshold voltage scanning order based on a memory parameter associated with the flash memory page; and
performing, using the processor, read threshold voltage calibration according to the read threshold voltage scanning order,
wherein the read threshold calibration scanning order includes a scanning order for a plurality of read thresholds, and wherein a first read threshold in the scanning order for the plurality of read thresholds corresponds to a comb of read threshold voltages having higher voltage values than at least one of the other read thresholds in the scanning order for the plurality of read thresholds.

8. The method of claim 7, wherein performing read threshold voltage calibration includes:
setting, using the processor, read threshold voltages for each of a plurality of read thresholds based on the read threshold voltage scanning order;
scanning, using the processor, a comb of read threshold voltages for a first of the plurality of read thresholds, the first of the plurality of read thresholds corresponding to the first read threshold in the read threshold voltage scanning order; and
selecting, using a processor, a read threshold voltage in the comb of read threshold voltages for the first of the plurality of read thresholds based on an error-correcting code ("ECC") metric.

9. The method of claim 8, wherein performing read threshold voltage calibration includes:
advancing, using the processor, the read threshold voltage calibration to a second of the plurality of read thresholds after selecting the read threshold voltage in the comb of read threshold voltages for the first of the plurality of read thresholds;

scanning, using the processor, a comb of read threshold voltages for the second of the plurality of read thresholds, the second of the plurality of read thresholds corresponding to the second read threshold in the read threshold voltage scanning order; and selecting, using the processor, a read threshold voltage in the comb of read threshold voltages for the second of the plurality of read thresholds based on the ECC metric.

10. The method of claim 9, wherein performing read threshold voltage calibration includes:

advancing, using the processor, the read threshold voltage calibration to a third of the plurality of read thresholds after selecting the read threshold voltage for the second of the plurality of read thresholds;

scanning, using the processor, a comb of read threshold voltages for the third of the plurality of read thresholds, the third of the plurality of read thresholds corresponding to the third read threshold in the read threshold voltage scanning order; and selecting, using the processor, a read threshold voltage in the comb of read threshold voltages for the third of the plurality of read thresholds based on the ECC metric.

11. The method of claim 10, wherein the ECC metric is a syndrome weight.

12. The method of claim 7, wherein the memory parameter is selected from the group consisting of: a structural characteristic of the non-volatile memory, an operational mode of the controller, and a condition of the non-volatile memory.

13. A controller for controlling read threshold voltage calibration, the controller including a non-transitory computer readable medium and a processor, the controller including computer executable instructions stored in the non-transitory computer readable medium to:

retrieve a flash memory page from the non-volatile memory;

determine a read threshold voltage scanning order based on a memory parameter associated with the flash memory page; and perform read threshold voltage calibration according to the read threshold voltage scanning order, wherein the read threshold calibration scanning order includes a scanning order for a plurality of read thresholds, and wherein a first read threshold in the scanning order for the plurality of read thresholds corresponds to a comb of read threshold voltages having higher voltage values than at least one of the other read thresholds in the scanning order for the plurality of read thresholds.

14. The controller of claim 13, the controller further comprising computer executable instructions stored in the non-transitory computer readable medium to, when performing read threshold voltage calibration:

set read threshold voltages for each of a plurality of read thresholds based on the read threshold voltage scanning order;

scan a comb of read threshold voltages for a first of the plurality of read thresholds, the first of the plurality of read thresholds corresponding to the first read threshold in the read threshold voltage scanning order; and select a read threshold voltage in the comb of read threshold voltages for the first of the plurality of read thresholds based on an error-correcting code ("ECC") metric.

15. The controller of claim 14, the controller further comprising computer executable instructions stored in the non-transitory computer readable medium to, when performing read threshold voltage calibration:

advance the read threshold voltage calibration to a second of the plurality of read thresholds after selecting the read threshold voltage in the comb of read threshold voltages for the first of the plurality of read thresholds;

scan a comb of read threshold voltages for the second of the plurality of read thresholds, the second of the plurality of read thresholds corresponding to the second read threshold in the read threshold voltage scanning order; and select a read threshold voltage in the comb of read threshold voltages for the second of the plurality of read thresholds based on the ECC metric.

16. The controller of claim 15, the controller further comprising computer executable instructions stored in the non-transitory computer readable medium to, when performing read threshold voltage calibration:

advance the read threshold voltage calibration to a third of the plurality of read thresholds after selecting the read threshold voltage for the second of the plurality of read thresholds;

scan a comb of read threshold voltages for the third of the plurality of read thresholds, the third of the plurality of read thresholds corresponding to the third read threshold in the read threshold voltage scanning order; and select a read threshold voltage in the comb of read threshold voltages for the third of the plurality of read thresholds based on the ECC metric.

17. The controller of claim 13, wherein the memory parameter is selected from the group consisting of: a structural characteristic of the non-volatile memory, an operational mode of the controller, and a condition of the non-volatile memory.

* * * * *